US008625299B2

(12) United States Patent
Huang

(10) Patent No.: US 8,625,299 B2
(45) Date of Patent: Jan. 7, 2014

(54) CIRCUIT BOARD WITH EVEN CURRENT DISTRIBUTION

(75) Inventor: Tsung-Sheng Huang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 197 days.

(21) Appl. No.: 13/220,709

(22) Filed: Aug. 30, 2011

(65) Prior Publication Data

US 2012/0325530 A1 Dec. 27, 2012

(30) Foreign Application Priority Data

Jun. 24, 2011 (TW) .............................. 100211640 A

(51) Int. Cl.
*H05K 1/11* (2006.01)
*H05K 1/14* (2006.01)

(52) U.S. Cl.
USPC ........... 361/792; 361/793; 361/794; 361/795; 174/261; 174/262; 174/263; 174/264; 174/265

(58) Field of Classification Search
USPC .................. 361/792–795, 760, 765, 807; 174/261–266, 260
See application file for complete search history.

(56) References Cited

U.S. PATENT DOCUMENTS

| 6,084,779 A * | 7/2000 | Fang .............................. 361/763 |
| 2008/0277153 A1* | 11/2008 | Teshome et al. .............. 174/262 |
| 2010/0236823 A1* | 9/2010 | Hu et al. ...................... 174/262 |

\* cited by examiner

*Primary Examiner* — Jayprakash N Gandhi
*Assistant Examiner* — Dion Ferguson
(74) *Attorney, Agent, or Firm* — Altis Law Group, Inc.

(57) ABSTRACT

A circuit board includes an outer conductive layer, a number of inner conductive layers, at least one group of vias defined through the outer conductive layer and the inner conductive layers and electrically connected each conductive layers, at least one power supply element, and at least one electronic element. The at least one group of vias surrounds the at least one power supply element. When the least one power supply element outputs current to the at least one electronic element, a first portion of the output current flows to the inner conductive layers through the group of vias surrounding the at least one power supply element to be input to the at least one electronic element, and a second portion of the output current flows into the at least one electronic element through the outer conductive layer.

9 Claims, 2 Drawing Sheets

CIRCUIT BOARD WITH EVEN CURRENT DISTRIBUTION

BACKGROUND

1. Technical Field

The disclosure generally relates to circuit boards, and particularly to a multilayer circuit board with an even current distribution and a higher current transmission efficiency.

2. Description of Related Art

A typical circuit board usually includes a plurality of conductive layers made of copper foil and a plurality of vias defined in the conductive layer to electrically connect the conductive layers. A voltage regulator module can provide electrical power to the circuit board by a plurality of power supply elements such as output choke coils. The power supply elements outputs current to an electronic element, such as a processor mounted to the circuit board by the vias and the conductive layers.

However, when the distribution of the vias arranged on the circuit board is irregular, current flowing through each via is different, that is the current distribution of the circuit board is uneven. Thus, the circuit board may be damaged by overheating in the areas with more current and have a shorter lifespan.

In addition, because some vias have lower current flowing through them, the total number of the vias arranged on the circuit board may be needed to be large to enable the current transmission, which may increase impedance of the circuit board and lead to a lower current transmission efficiency.

Therefore, there is room for improvement within the art.

BRIEF DESCRIPTION OF THE DRAWINGS

Many aspects of the present disclosure can be better understood with reference to the following drawings. The elements in the drawings are not necessarily drawn to scale, the emphasis instead being placed upon clearly illustrating the principles of the disclosure.

DETAILED DESCRIPTION

Figure 1:
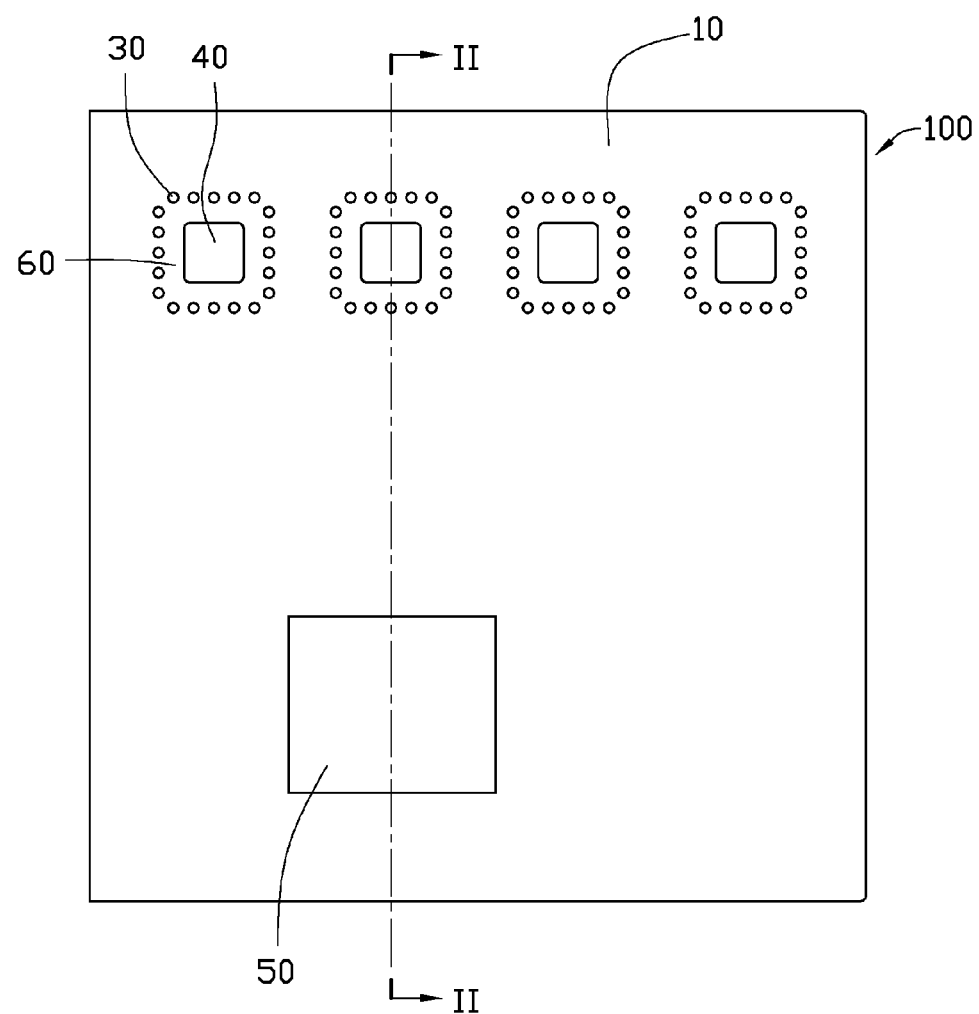
FIG. 1 is a schematic view of a circuit board, according to an exemplary embodiment of the disclosure.

FIG. 1 is a schematic view of a circuit board 100, according to an exemplary embodiment of the disclosure. The circuit board 100 includes an outer conductive layer 10, a plurality of inner conductive layers 20, a plurality of groups of vias 30, a plurality of power supply elements 40, and an electronic element 50. The power supply elements 40 and the electronic element 50 are mounted to the circuit board 100. The power supply elements 40 provide electrical power to the electronic element 50 through the conductive layers 10, 20 and the vias 30.

The outer conductive layer 10 and the inner conductive layers 20 may be signal layers or power supply layers. The outer conductive layer 10 and the inner conductive layers 20 are metal, in this exemplary embodiment, the outer conductive layer 10 and the inner conductive layers 20 are copper foil layers.

Figure 2:
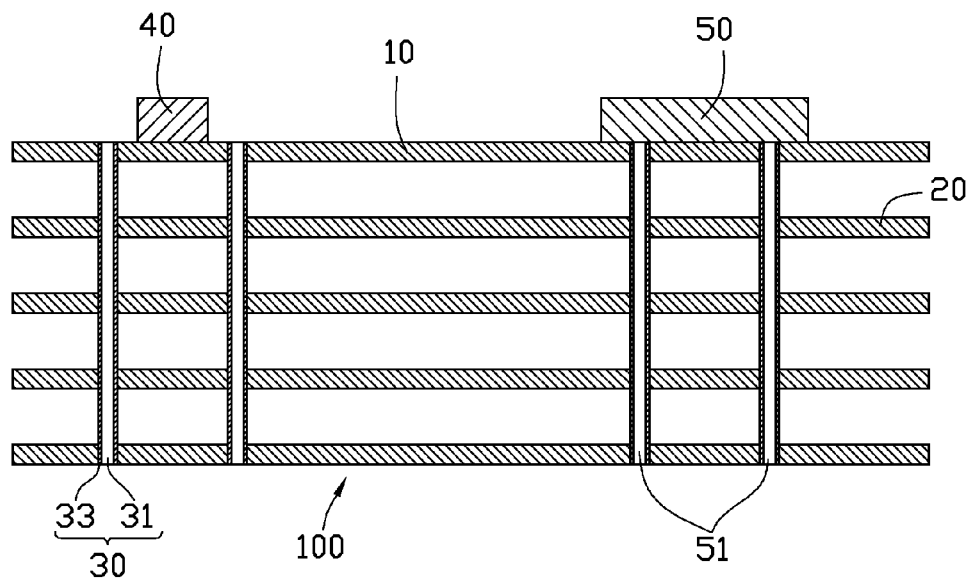
FIG. 2 is a cross-sectional view of the circuit board, taken along line II-II of FIG. 1.

Referring to FIG. 2, the vias 30 are defined through the outer conductive layer 10 and the inner conductive layers 20. Each via 30 includes a through hole 31 and a conductive inner wall 33. The conductive inner wall 33 is plated on an inner surface of each through hole 31. Thus, the outer conductive layer 10 and the inner conductive layers 20 can be electrically connected by the conducive inner walls 33.

In this exemplary embodiment, each group of vias 30 is arranged surrounding each power supply element 40 forming a current flowing region 60. A shape of the current flowing region 60 corresponds to a profile of the power supply element 40. In exemplary embodiment, the current flowing region 60 is rectangular. When the power supply elements 40 provide electrical power to the electronic element 50, current is output into the current flowing region 60. Then a first portion of the output current flows to the inner conductive layers 20 through the vias 30 to be input to the electronic element 50, and a second portion of the output current flows into the electronic element 50 through the outer conductive layer 10. Thus, the power supply elements 40 can provide electrical power to the electronic element 50 by the outer conductive layer 10, the inner conductive layers 20, and the vias 30.

The number of each group of vias 30 surrounded each power supply element 40 can be changed according to a value of the current output from each power supply element 40 and a maximum value of the current flowing through each via 30. In the illustrated embodiment, for example, when the value of the current output from each power supply element 200 is about 40 A, and the maximum current flowing through each via 30 is about 2.5 A, the number of each group of vias 30 is about twenty.

In an exemplary embodiment, the electronic element 50 is a processor. A plurality of component holes 51 (shown in FIG. 2) is defined in the circuit board 100 corresponding to the electronic element 50. Pins (not shown) of the electronic element 50 can be received in the component holes 51.

The structure of each component hole 51 is substantially similar to the vias 30. The electronic element 50 is electrically connected to the conductive layers 10, 20 by the component holes 51. Therefore, the first portion of the current flowing through the inner conductive layers 20, and the second portion of the current flowing through outer conductive layer 10 is converged at the component holes 51 on the outer conductive layer 10 and input into the electronic element 50 through the outer conductive layer 10.

The groups of vias 30 arranged surrounding each power supply element 40 have a regular distribution, and current flowing through each via has almost the same value. Thus, the circuit board can have even current distribution. In addition, because each via 30 is effectively used, the total number of the vias 30 can be reduced to obtain higher current transmission efficiency.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A circuit board, comprising:
   an outer conductive layer;
   a plurality of inner conductive layers;
   at least one group of vias defined through the outer conductive layer and the inner conductive layers and each via electrically connecting the outer conductive layer to each conductive layer;
   at least one power supply element corresponding to the at least one group of vias; and
   at least one electronic element; wherein the at least one group of vias surrounds the at least one power supply element, when the least one power supply element outputs current to the at least one electronic element, a first portion of the output current flows to each inner conductive layer through the group of vias surrounding the at least one power supply element to be input to the at least one electronic element, and a second portion of the output current flows into the at least one electronic element through the outer conductive layer.

2. The circuit board of claim 1, wherein the group of vias surrounding the at least one power supply element forms a current flowing region, the current is output into current flowing region and then provided to the at least one electronic element.

3. The circuit board of claim 1, wherein the number of each group vias are determined according to a value of the current output from the at least one power supply element and a maximum value of the current flowing through each via.

4. The circuit board of claim 1, further comprising a plurality of element holes defined in the conductive layers corresponding to the at least one electronic element, wherein the at least one electronic element is electrically connected to the conductive layers by the component holes.

5. The circuit board of claim 4, wherein the first portion of the current flowing through the inner conductive layers, and the second portion of the current flowing through outer conductive layer is converged at the component holes on the outer conductive layer and input into the electronic element through the outer conductive layer.

6. The circuit board of claim 1, wherein the current flowing region is rectangular.

7. The circuit board of claim 1, wherein the conductive layers are signal layers or power supply layers.

8. The circuit board of claim 1, wherein the conductive layers are copper foil layers.

9. The circuit board of claim 1, wherein the at least one electronic element is a processor.

* * * * *